United States Patent
DelPrete et al.

(10) Patent No.: US 6,790,057 B2
(45) Date of Patent: Sep. 14, 2004

(54) CONDUCTIVE ELASTOMERIC CONTACT SYSTEM WITH ANTI-OVERSTRESS COLUMNS

(75) Inventors: Stephen D. DelPrete, Rehoboth, MA (US); Steven Wakefield, Watertown, MA (US); Peter D. Wapenski, Foster, RI (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

(21) Appl. No.: 10/687,062

(22) Filed: Oct. 16, 2003

(65) Prior Publication Data

US 2004/0110401 A1 Jun. 10, 2004

Related U.S. Application Data

(63) Continuation-in-part of application No. 10/315,298, filed on Dec. 10, 2002, now Pat. No. 6,669,490.

(51) Int. Cl.[7] .............................................. H01R 4/58
(52) U.S. Cl. ............................................ 439/91; 439/66
(58) Field of Search ............................. 439/86, 91, 66, 439/591

(56) References Cited

U.S. PATENT DOCUMENTS

| | | | |
|---|---|---|---|
| 3,971,610 A | 7/1976 | Buchoff et al. ........... 339/17 R |
| 5,397,240 A | 3/1995 | Herard ........................ 439/66 |
| 5,474,458 A | 12/1995 | Vafi et al. ...................... 439/91 |
| 5,599,193 A | 2/1997 | Crotzer ........................ 439/66 |
| 5,624,268 A | 4/1997 | Maeda et al. ................. 439/66 |
| 6,056,557 A | 5/2000 | Crotzer et al. ............... 439/66 |
| 6,271,482 B1 | 8/2001 | Crotzer et al. ............. 174/262 |
| 6,348,659 B1 | 2/2002 | Crotzer et al. ............. 174/68.1 |
| 6,394,821 B1 | 5/2002 | Matsumura et al. .......... 439/91 |
| 6,416,331 B1 | 7/2002 | Shimizu ....................... 439/66 |
| 6,709,277 B2 * | 3/2004 | Ruttan et al. ................. 439/66 |
| 2003/0186572 A1 * | 10/2003 | Hougham et al. ............ 439/91 |

* cited by examiner

*Primary Examiner*—Tho D. Ta (57) ABSTRACT

A connector for board-to-board and board-to-device interconnect applications includes a plurality of conductive elastomeric columnar contacts arranged in a contact array and retained in a first plurality of openings in an insulative substrate and a plurality of stops retained in a second plurality of openings in the insulative substrate. The stops are dispersed among the contacts of the contact array or positioned on the periphery of the contact array and located in non-abutting relation with respect to adjacent contacts. The contacts and the stops have opposing end surfaces and the end surfaces of the contacts are located a greater distance from the substrate than the end surfaces of the stops such that the stops limit the compression of the elastomeric contacts when the connector is disposed in its intended mounting orientation.

10 Claims, 6 Drawing Sheets

CONDUCTIVE ELASTOMERIC CONTACT SYSTEM WITH ANTI-OVERSTRESS COLUMNS

CROSS REFERENCE TO RELATED APPLICATIONS

The present application is a continuation-in-part of U.S. patent application Ser. No. 10/315,298 filed Dec. 10, 2002, now U.S. Pat. No. 6,669,490.

STATEMENT REGARDING FEDERALLY SPONSORED RESEARCH OR DEVELOPMENT

N/A

BACKGROUND OF THE INVENTION

The present invention relates to connectors and more specifically to an interconnect system that utilizes conductive elastomeric columnar contacts to achieve conductive interconnection between opposing arrays of conductive contact pads.

Interconnect devices using elastomeric conductive members are known. One such interconnect device is disclosed in U.S. Pat. No. 6,056,557. In this interconnect device, conductive resilient members are disposed in holes in a substrate on a predetermined grid array and the assembly is positioned between adjacent printed circuit boards so as to make conductive contact between conductive pads on opposing boards.

Other connectors employing conductive elastomeric columns are disclosed in U.S. Pat. Nos. 5,599,193, 5,624,268, 6,271,482 and 6,348,659.

In board to device interconnect applications, such as board to Land Grid Array (LGA) or Ball Grid Array (BGA) devices it is important to maintain accurate positioning of the respective columnar contacts while avoiding distortion of the conductive elements that can result from the application of axial compressive forces to the contacts of the connector.

Accordingly, it would be desirable to have a connector system that employs conductive elastomeric columnar contacts that permit board to board or board to device interconnections and that maintain accurate alignment of the contacts in a predetermined array pattern. It would further be desirable for the contact positioning and shape to be resistant to distortion due to applied compressive forces that might adversely affect either the conductivity or positional accuracy of the contacts.

BRIEF SUMMARY OF THE INVENTION

A connector for use in interconnect applications comprises a plurality of conductive elastomeric columnar contacts retained in an insulating substrate and arranged in a predetermined pattern. The elastomeric columnar contacts are each surrounded by a support column molded of an insulative polymer, such as silicone. In one embodiment, the support columns have a generally cylindral outer surface. The support columns provide mechanical support for and tend to reduce the deformation of the conductive elastomeric columnar contacts when the columnar contacts are subjected to compressive axial forces. Additionally, intermediate columns are formed between at least some of the support columns. The intermediate columns serve as mechanical stops and resist further compression of the connector in response to the application of excessive axial compressive forces to the contacts and the support columns. The location of the intermediate columns corresponds to the location of injection ports used in the molding of the intermediate columns and the support columns. Passageways are provided in the mold that allow for the flow of material from the point of injection at the respective intermediate column to one or more adjacent support columns. Insulative bridges are thus formed between the intermediate columns and the support columns in the location of such passageways. The height of the bridges above the substrate is equal to or less than the height of the intermediate columns above the substrate.

In one embodiment of the invention, a plurality of conductive elastomeric columnar contacts are supported by and retained in a substrate, such as a polyimide sheet, to form a contact assembly. The contact assembly is positioned in a mold and an insulative polymer, such as silicon, is injected into the mold to form the support columns and the intermediate columns. The columnar contacts have opposing tips that protrude slightly beyond the respective opposing end surfaces of the support columns to allow the tips of the columnar contacts to make conductive contact with corresponding pads located on printed circuit boards, an LGA device or a BGA device, as applicable. The height of the end surfaces of the intermediate columns is specified to serve as a mechanical stop so as to resist further compression of the connector in response to the application of excessive axial compressive forces on the contacts and the support columns.

A connector in accordance with the present invention may be produced by molding the conductive elastomeric columnar contacts in a first molding operation and by molding the support columns, the intermediate columns and the insulative bridges as an integral structure in a second molding operation.

In another embodiment of the invention an insulative substrate such as a polyimide sheet is provided having first and second pluralities of openings arranged in first and second hole patterns. Conductive elastomeric contact members are provided that extend through the first plurality of openings to form a contact member array, and insulative polymer columns or stops are provided that extend through the second plurality of openings. The contact members extend from the substrate a greater distance than the stops. The stops serve to limit the compression on the conductive elastomeric contact members when the connector is disposed between opposed contacting surfaces. In this manner, overstress on the conductive elastomeric contact members is avoided. The stops are located in non-abutting relation with respect to the contact members and may be selectively positioned within the array of contact members or on the periphery of the contact member array. The contact members and stops include a generally circumferential recess defining opposing shoulders, and the substrate is captured between the opposing shoulders of the recesses in the contact members and the stops to retain the contact members and the stops in position within the substrate.

The contact members and stops may be formed in first and second molding operations as discussed above.

Other features, aspects and advantages of the above described connector and methods of making the same will be apparent to those of ordinary skill in the art from the detailed description of the invention that follows.

BRIEF DESCRIPTION OF THE SEVERAL VIEWS OF THE DRAWING

The invention will be more fully understood by reference to the following Detailed Description of the Invention in conjunction with the drawing of which.

DETAILED DESCRIPTION OF THE INVENTION

A connector for making a board-to-board or board to device electrical interconnection and a method for making the connector is disclosed. Referring to FIGS. 1–5, the connector 10 includes an insulative substrate 12 such as a polyimide sheet (e.g. Kapton(™)), and a plurality of conductive elastomeric columnar contacts 14 retained within the substrate 12. The columnar contacts 14 and the substrate 12 form a contact assembly 16 that is subsequently discussed in greater detail. The connector 10 includes generally cylindrical insulative support columns 18 that surround and abut the columnar contacts 14. Additionally the connector 10 includes insulative intermediate columns 20. Each of the intermediate columns 20 is disposed adjacent to selected group of one or more support columns 18. Each support column 20 surrounds a single elastomeric columnar contact 14 and provides mechanical support for the respective contact. Insulative bridges 22 extend between each intermediate column 20 and at least one adjacent support columns 18 within the respective selected group of support columns 18. The insulative bridges 22 are the by product of passageways within a mold that allow for molding of the support columns 18 by the injection of fluid insulative material via ports that are located at the respective sites of the intermediate columns 20. The injected insulative material flows through the passageways into the mold areas that define the intermediate columns, the support columns 18 and the bridges 22 and remain in the passageways that define the bridges following the curing of the insulative material.

Figure 1:
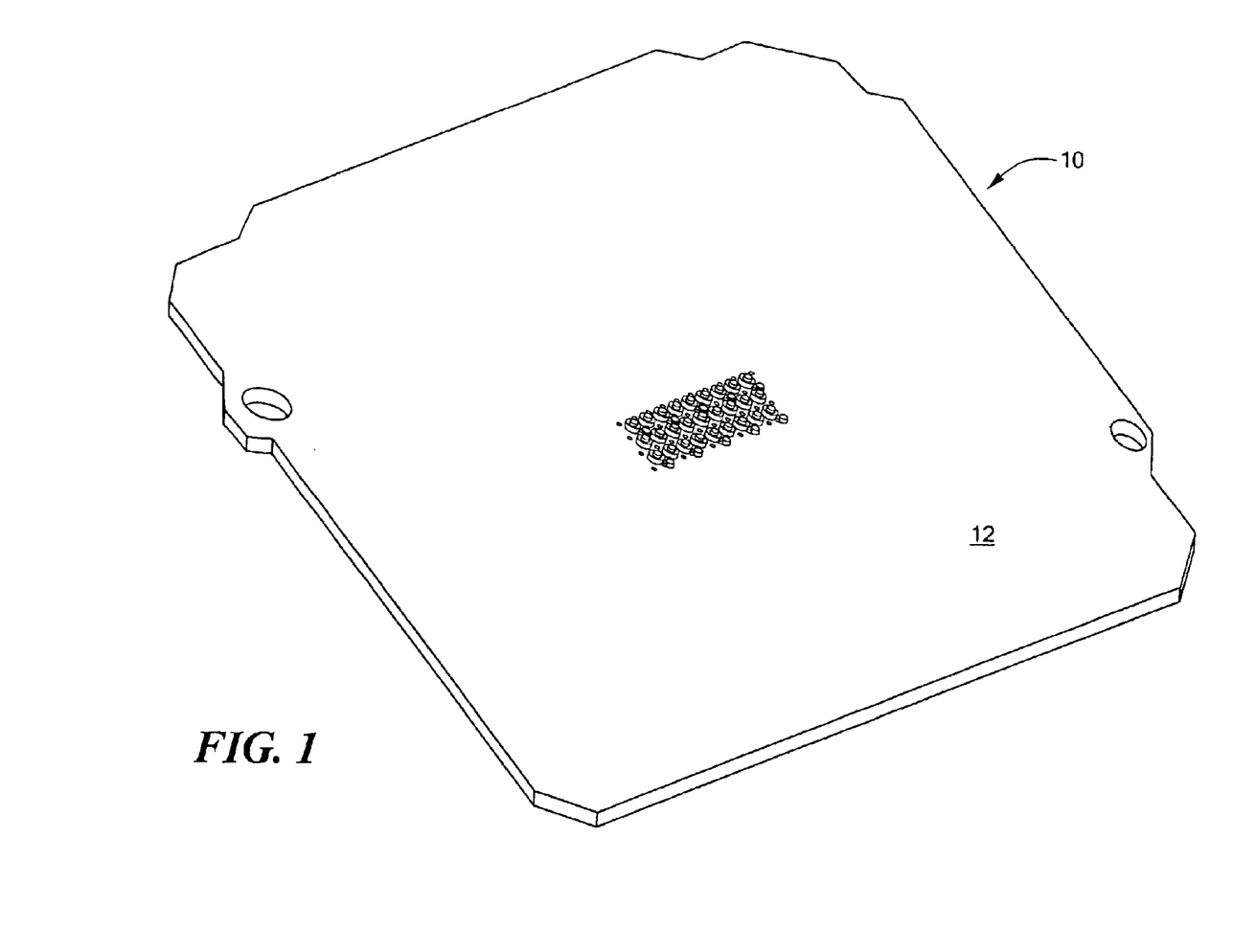
FIG. 1 is a perspective view of a connector in accordance with the present invention.
Figure 2:
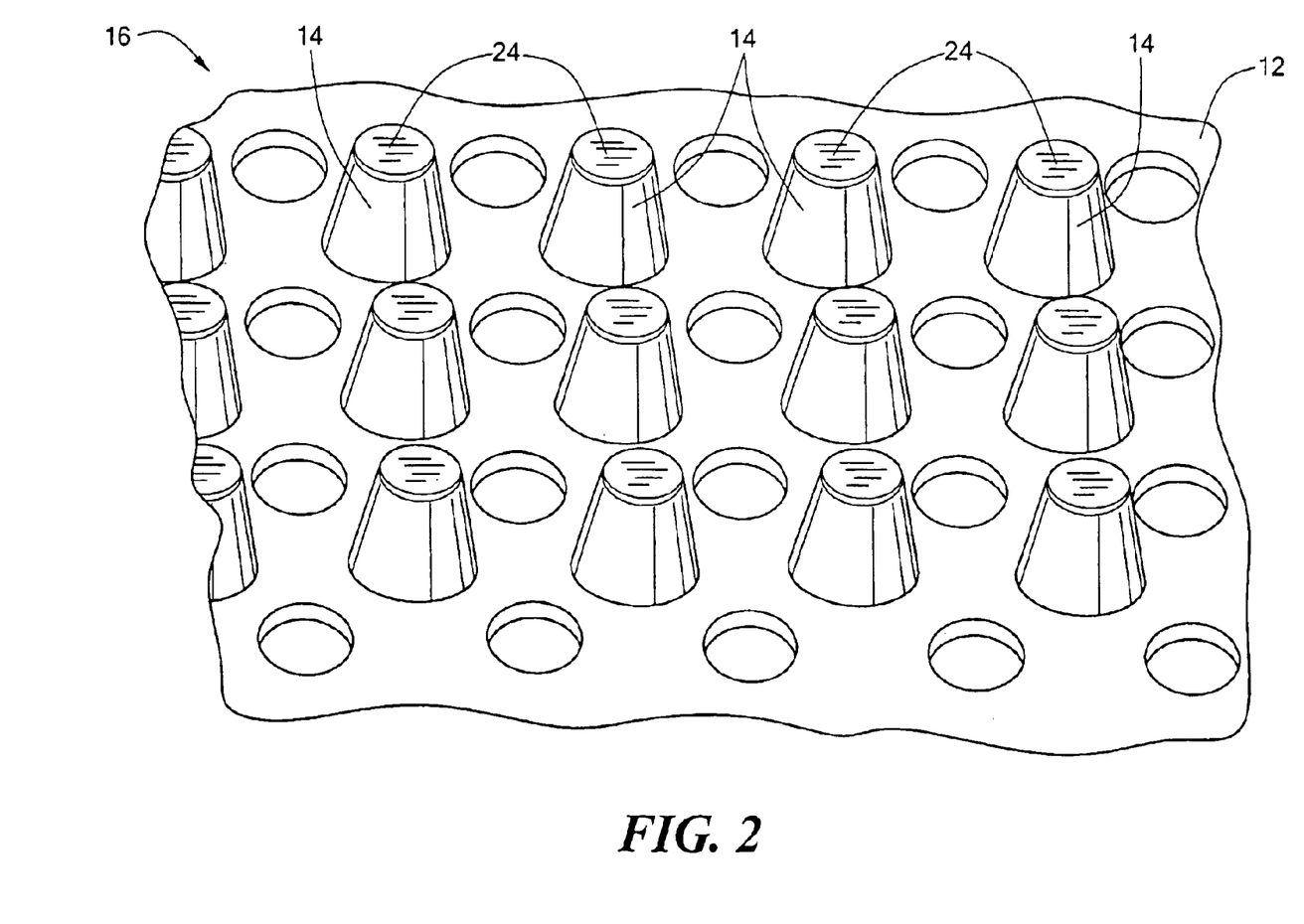
FIG. 2 is a perspective view of a contact assembly employed in the connector of FIG. 1.

The columnar contacts 14 are retained within the substrate 12 in a predetermined array and, in one embodiment the support columns 18, the intermediate columns 20 and the bridges 22 are molded as an integral structure out of an insulative polymer, such as silicone.

The insulative substrate 12 includes first and second pluralities of holes arranged in first and second respective hole arrays. Except for holes at the edge of the array, each of the holes in the second plurality of holes is surrounded by holes within the first hole array. The size of the substrate may vary based on the particular application. For example, alignment holes may be provided in the substrate 12 outboard of the first and second pluralities of holes. The contact assembly 16 is formed by molding conductive elastomeric contacts 14 in a predetermined array such that the contacts 14 extend through selected ones of said first plurality of holes and are captively retained within the substrate 12. The conductive elastomeric contacts 14 may be formed via any process known in the art. In the illustrative embodiment, the portion of the columnar contact 14 extending from the substrate 12 is in the form of a frustum with the largest diameter of the frustrum adjacent the substrate 12. It should be appreciated however, that any suitable columnar shape may be employed for the columnar contacts 14.

In a first molding operation, the substrate 12 is inserted into a first mold and a conductive elastomeric material is injected into the mold to form the plurality of integral columnar contacts 14 so that the columnar contacts 14 extend from either side of the substrate 12. The diameter of the contacts 14 at the point at which the contacts abut the substrate 12 is greater than the diameter of the corresponding hole in the substrate 12 through which the columnar contact 14 extends. Consequently, following curing of the conductive elastomeric material to form the conductive contacts 14, the contacts 14 extend outward from opposing sides of the substrate 12 and are captively retained within the substrate 12. The first plurality of holes in the substrate 14 may be provided on a first predetermined grid, and the columnar contacts 14 may be molded so as to produce a contact assembly 16 having columnar contacts 14 captively retained in the substrate on the first predetermined grid.

The insulative support columns 18 and the insulative intermediate columns 20 connected by the insulative bridges 22 may be formed as an integral structure in a second molding operation. In the second molding operation, the contact assembly 16 is aligned within a mold and an insulative polymer is injected into the mold at the site of the intermediate columns 20 to form the support columns 18, the intermediate columns 20 and the bridges 22 as a unitary integral structure. The intermediate columns 20 extend through selected ones of the second plurality holes in the substrate 12.

Figure 4:
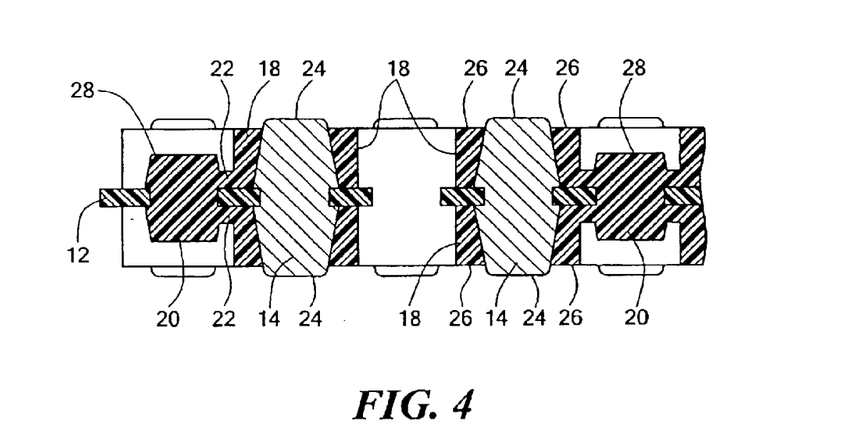
FIG. 4 is a cross-sectional view of the connector of FIG. 3 along a portion of section ZZ.
Figure 5:
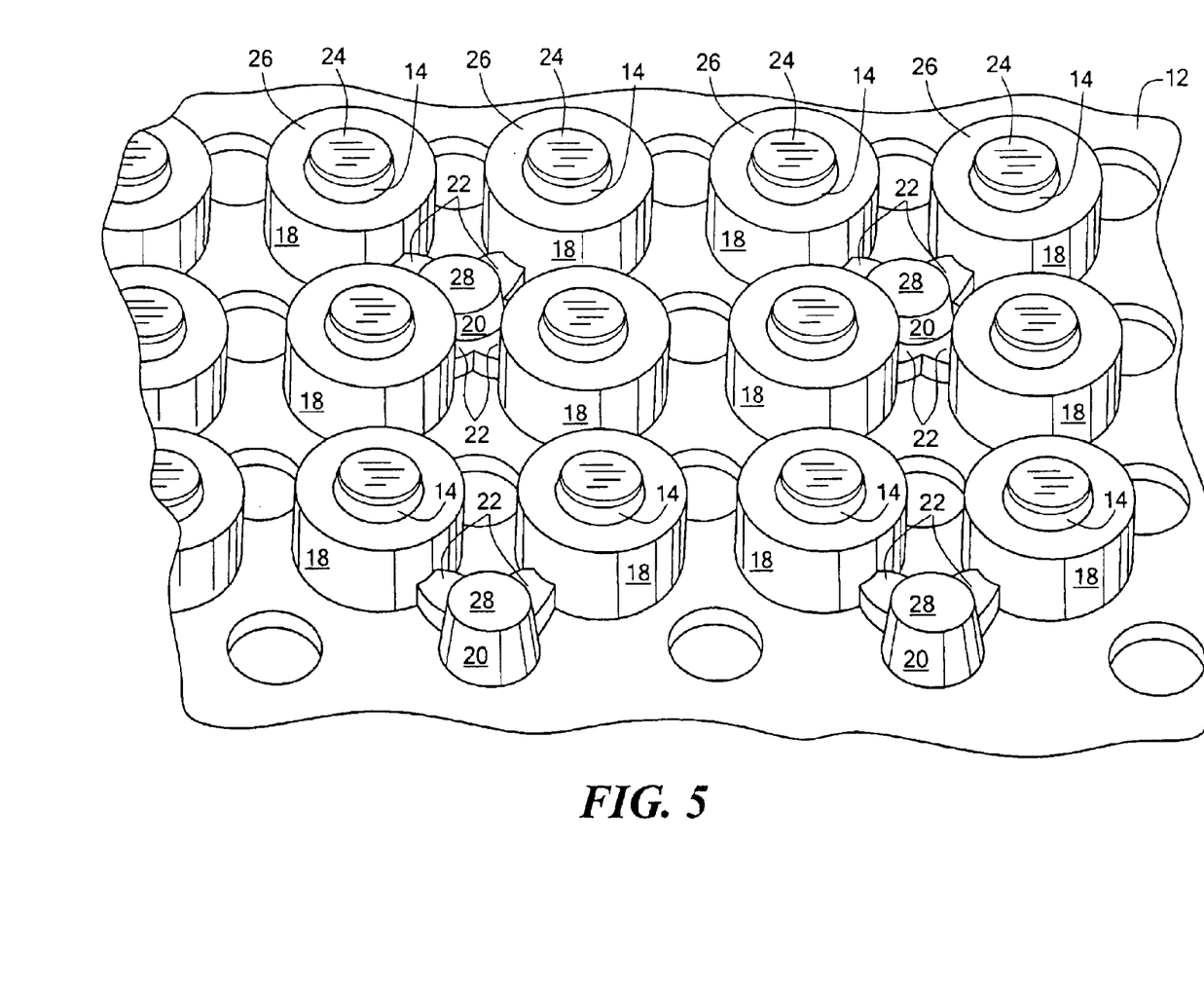
FIG. 5 is perspective view of an enlarged portion of the connector depicted in FIG. 2.

The support columns 18 generally have a cylindrical outer surface, as indicated above, and surround and abut the respective columnar contacts 14. Except for the insulative bridges, the support columns 18 and the intermediate columns are generally free standing cylindrical columnar structures in the illustrated embodiment although other cross-sections may be fabricated. The contacts 14 have opposing contact tips 24 that protrude slightly beyond the respective end surfaces 26 of support columns 18. The support columns 18 provide support for the conductive columnar contacts 14 and resist deformation of the contacts 14 when the connector 10 is mounted between two printed circuit boards or between a printed circuit board and a BGA or LGA device and is subjected to axial compressive forces.

Figure 3:
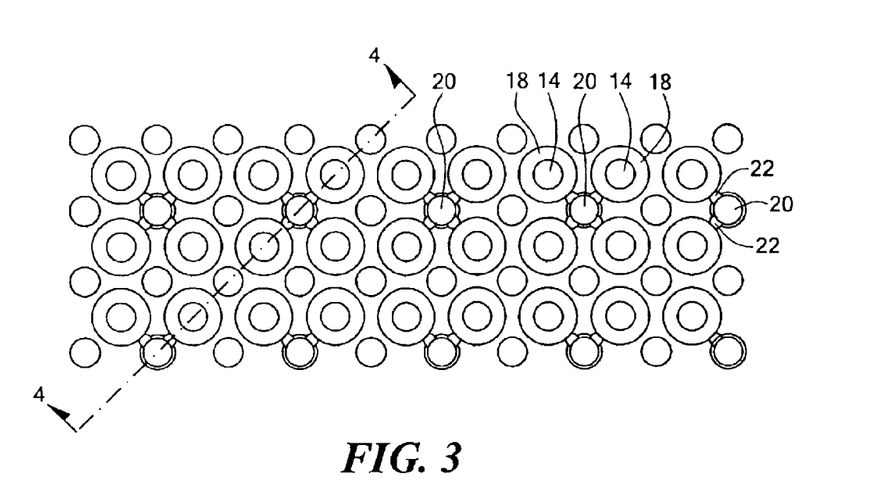
FIG. 3 is a top plan view of the connector of FIG. 1.

To further resist deformation of the contacts 14 the intermediate columns 20 are formed between groups of support columns 18 and corresponding contacts 14. The opposing ends of the intermediate columns 20 are generally planar and serve as stops that resist compression of the connector in response to the application of excessive axial compressive forces on the columnar contacts 14 and the support columns 18. The outer surface of at least a portion of each intermediate column 20 is spaced equidistant from the outer surfaces of adjacent support columns 18 in one embodiment. Any desired number of intermediate columns 20 may be employed and the intermediate columns 20 may be interspersed within the array of support columns 18.

The intermediate columns 20 extend above and below opposing sides of the substrate 12 and through selected ones of the second plurality of holes in the substrate 12. The intermediate columns 20 have generally planar opposing end surfaces 28 that are spaced from the surface of the respective substrate 12 by a first predetermined distance. The support columns 18 have opposing end surfaces 26 that are spaced from the respective surface of the substrate 12 by a second predetermined distance. The first predetermined distance is less than the second predetermined distance in the presently disclosed embodiment. Accordingly, the intermediate columns 20 serve as stop flanges that effectively limit the amount of vertical compression of the columnar contacts 14 and the support columns 18 that can occur before the surface of the applicable printed circuit board, LGA or BGA device bottoms out on the end surfaces 28 of the intermediate columns 20.

While the tips of the columnar contacts 14 are depicted as being generally planar at the tip ends, the tips may be hemispherical, conical or of any other suitable shape to engage a mating contact pad.

Figure 6A:
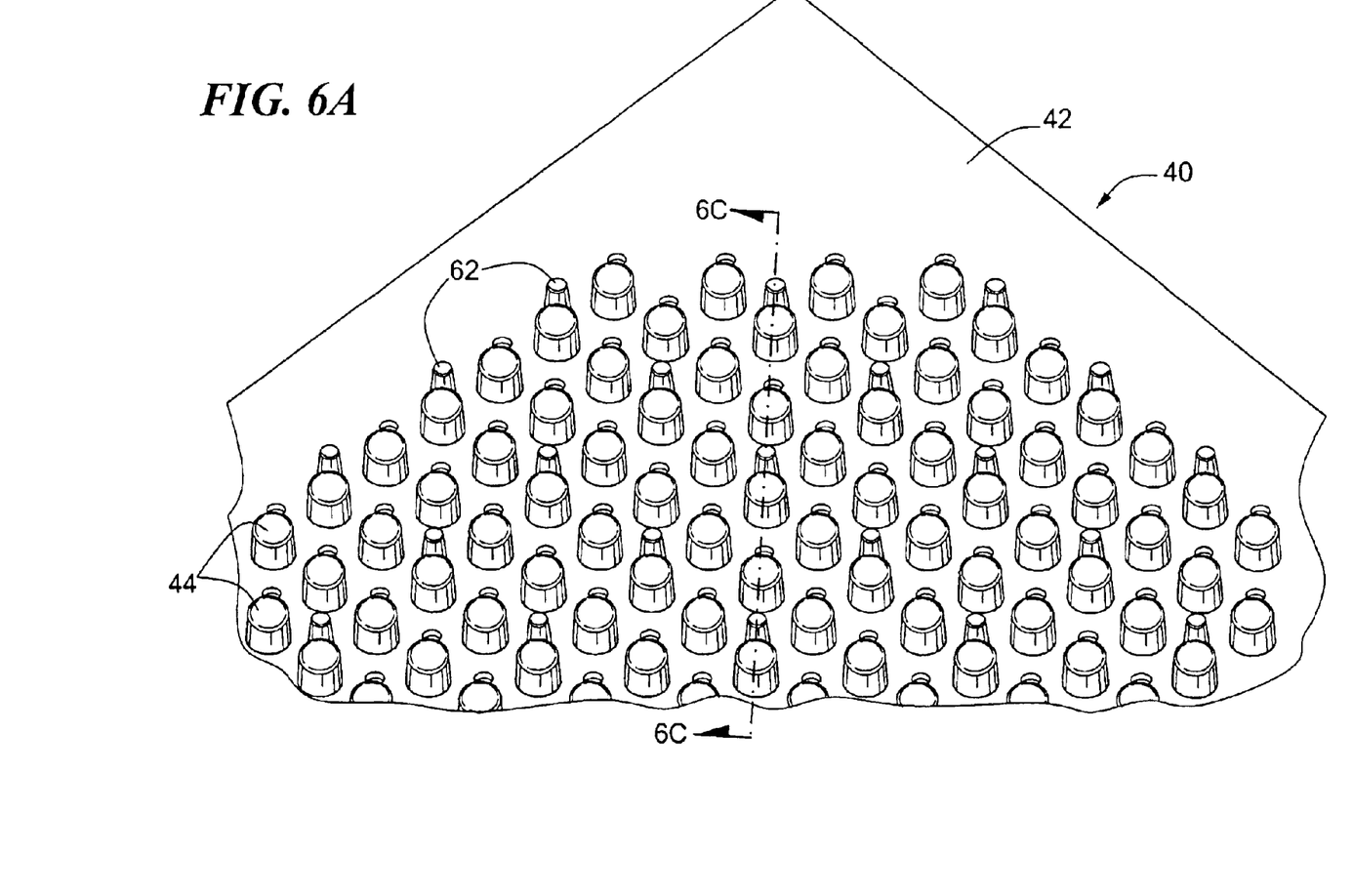
FIG. 6A is a perspective view of a connector depicting another embodiment of the invention.
Figure 6B:
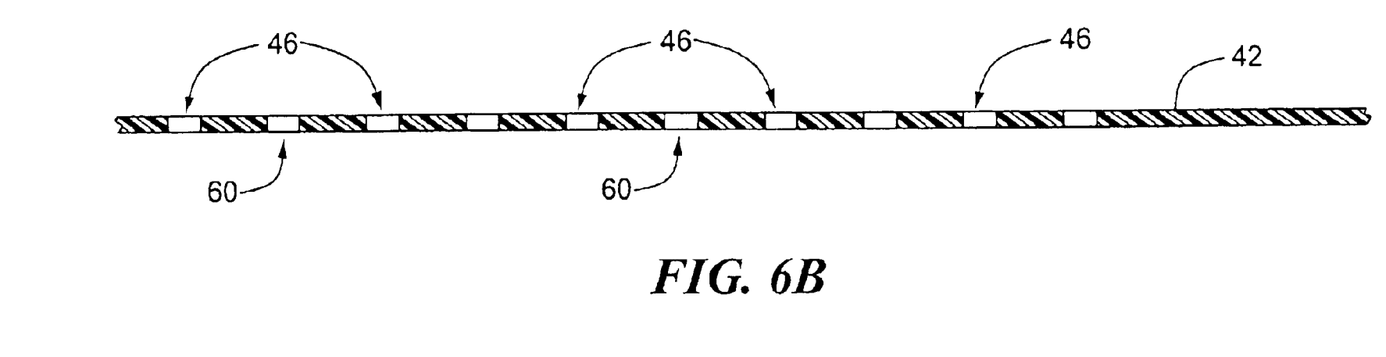
FIG. 6B is a side cross-sectional view of the substrate depicted in FIG. 6a without the contacts or stops in place.
Figure 6C:
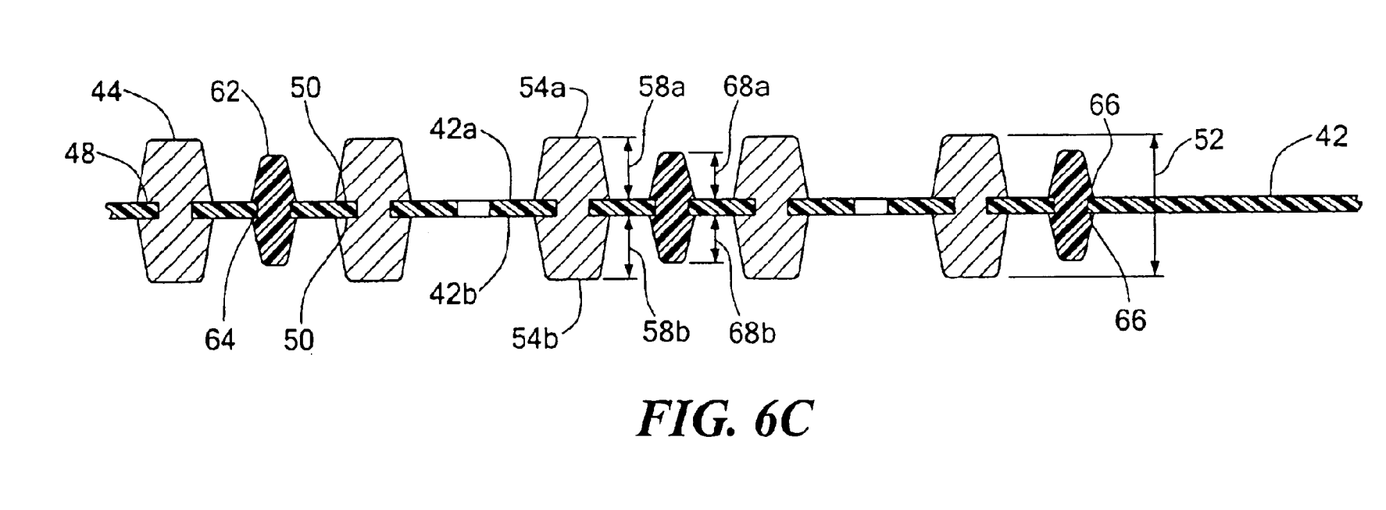
FIG. 6C is a side cross-sectional view of the connector of FIG. 6A.

Another embodiment of a connector in accordance with the present invention is depicted in FIGS. 6A–6C. The connector 40 includes an insulative substrate 42 such as a polyimide sheet, and a plurality of conductive elastomeric columnar contacts 44 retained in openings 46 (see FIG. 6B) arranged in a predetermined array within the substrate 42. The columnar contacts 44 include a circular recess 48 (see FIG. 6C) around the circumference of the contacts 44 sized to capture the substrate 42 between opposing shoulders 50 of the recess 48. The contacts 44 have opposing ends 54a, 54b that define a contact height 52. One end 54a of each contact 44 extends above a first surface 42a of the substrate 42 by a first height 58a and the opposing end 54b of the contact extends below the opposing surface 42b of the substrate 42 by a second height 58b, which is equal to the first height 58a in the illustrated embodiment. It is recognized however, that the first and second heights 58a, 58b need not be equal. The portions of the columnar contacts 44 extending from the substrate 42 may be frustums, generally cylindrical, or any other suitable shape.

The substrate 42 further includes a second plurality of openings 60 (see FIG. 6B) selectively positioned within the array formed by the first plurality of openings 46 for the contacts 44. As illustrated in FIG. 6C, insulative polymer columns or stops 62 are mounted within the second plurality of openings 60. The stops 62 are spaced from the columnar contacts 44. The polymer stops 62 serve to limit the compression of the contacts 44 when the connector 40 is disposed in a mounting position between opposing contact surfaces. More specifically, the polymer stops 62 each have a recess 64 around the circumference of the stops 62. The stops 62 capture the substrate 42 between opposing shoulders 66 of the recesses 64 to securely mount the stops 62 within the openings 60 through the substrate 42.

The polymer stops 62 may be fabricated of silicone or any other suitable insulative material. Additionally, in certain applications, it may be preferable to fabricate the stops from a conductive material. The portions of the polymer stops extending from the substrate 42 may be frustums, generally cylindrical, or any other suitable shape.

The polymer stops 62 extend above the first surface 42a of the insulative substrate 42 by a height 68a that is less than the height 58a, and the polymer stops 62 extend below the second surface 42b of the insulative substrate 42 by a height 68b that is less that the second height 58b. Thus, when the connector 40 is disposed in a mounting position and compressed between surfaces having electrical contacts disposed thereon, the conductive elastomeric contacts 44 compress until the polymer stops 62 limit further compression of the contacts 44. In this manner, the desired amount of compression may be obtained and overstress on the columnar contacts 44 is avoided.

In the embodiment depicted in FIG. 6A, the stops 62 are positioned within the array of columnar contacts 44. It should be noted however, that some or all of the stops 62 may be located outside the perimeter of the columnar contact array. When the stops 62 are located on the periphery of the array of columnar contacts 44, rectangular shaped stops may be employed in addition to the stop shapes previously described.

It will be appreciated by those of ordinary skill in the art that modifications to and variations of the above described connectors and methods of producing the same may be made without departing from the inventive concepts disclosed herein. Accordingly, the invention should not be viewed as limited except as by the scope and spirit of the appended claims.

What is claimed is:

1. An electrical connector comprising:
   an insulative substrate having first and second pluralities of openings therethrough, said first and second pluralities of openings being arranged in first and second array patterns, said substrate having first and second opposing surfaces;
   a plurality of conductive elastomeric contact members mounted in respective ones of said first plurality of openings, each of said conductive elastomeric contact members having first and second opposing end surfaces that are spaced first and second distances from said first and second opposing substrate surfaces respectively; and
   a plurality of non-conductive stops mounted in respective ones of said second plurality of openings, each of said non-conductive stops having first and second opposing end surfaces that are spaced third and fourth distances from said first and second opposing substrate surfaces respectively, wherein said third distance is less than said first distance and said fourth distance is less than said second distance, and wherein each of said stops is spaced from adjacent ones of said contact members.

2. The connector of claim 1 wherein said first and second distances are equal and said third and fourth distances are equal.

3. The connector of claim 1 wherein each one of said plurality of contacts include first and second contact portions projecting from said first and second surfaces respectively, and wherein said first and second contact portions are generally cylindrical.

4. The connector of claim 1 wherein each one of said plurality of contacts include first and second contact portions projecting from said first and second surfaces respectively, and wherein said first and second contact portions are generally frustums.

5. The connector of claim 1 wherein each one of said stops include first and second stop portions projecting from said first and second surfaces respectively, and wherein said first and second stop portions are generally cylindrical.

6. The connector of claim 1 wherein each one of said stops include first and second stop portions projecting from said first and second surfaces respectively, and wherein said first and second stop portions are generally frustums.

7. The connector of claim 1 wherein said substrate comprises a polyimide sheet.

8. The connector of claim 1 wherein said non-conductive stops comprise a polymer.

9. The connector of claim 8 wherein said polymer is silicone.

10. A method for forming a connector comprising:

in a first molding operation, forming a first plurality of conductive elastomeric contacts such that the elastomeric contacts are captively retained within a corresponding first plurality of holes within a generally planar non-conductive substrate having said first plurality of holes arranged in a first array pattern and a second plurality of holes arranged in a second array pattern, said elastomeric contacts having an outer surface and opposing end surfaces; and in a second molding operation, forming a plurality of non-conductive stops that extend through said second plurality of holes, said stops having opposing end surfaces and an outer surface, said elastomeric contact end surfaces extending from said substrate a distance greater than said stop end surfaces, each one of said stops being spaced from adjacent ones of said plurality of conductive contacts.

* * * * *